United States Patent
Chang et al.

(10) Patent No.: US 10,271,420 B2
(45) Date of Patent: Apr. 23, 2019

(54) ELECTRONIC APPARATUS

(71) Applicant: MediaTek Inc., Hsin-Chu (TW)

(72) Inventors: PoHao Chang, New Taipei (TW); Chun-Wei Chang, Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 118 days.

(21) Appl. No.: 15/134,922

(22) Filed: Apr. 21, 2016

(65) Prior Publication Data

US 2016/0338190 A1 Nov. 17, 2016

Related U.S. Application Data

(60) Provisional application No. 62/162,299, filed on May 15, 2015.

(51) Int. Cl.
| | |
|---|---|
| *H05K 1/00* | (2006.01) |
| *H05K 1/18* | (2006.01) |
| *H05K 7/00* | (2006.01) |
| *H05K 1/02* | (2006.01) |
| *H05K 1/09* | (2006.01) |

(52) U.S. Cl.
CPC ............ *H05K 1/0213* (2013.01); *H05K 1/09* (2013.01); *H05K 2201/10159* (2013.01)

(58) Field of Classification Search
CPC ............... H05K 1/0213; H05K 1/09; H05K 2201/10159
See application file for complete search history.

(56) References Cited

U.S. PATENT DOCUMENTS

| | | | | |
|---|---|---|---|---|
| 7,180,327 | B2 * | 2/2007 | So ............ | G11C 5/04 326/30 |
| 7,245,145 | B2 * | 7/2007 | Pax ........... | G11C 5/025 326/30 |
| 7,777,517 | B2 * | 8/2010 | Hiraishi ...... | G11C 7/04 326/30 |
| 2005/0094425 | A1 * | 5/2005 | Cogdill ....... | G11C 5/063 365/63 |
| 2010/0020584 | A1 * | 1/2010 | Xu ............ | G11C 5/04 365/63 |
| 2011/0176345 | A1 * | 7/2011 | Chen .......... | H05K 1/025 365/51 |
| 2013/0223123 | A1 * | 8/2013 | Lee ........... | G11C 5/06 365/63 |

* cited by examiner

*Primary Examiner* — Yuriy Semenenko
(74) *Attorney, Agent, or Firm* — McClure, Qualey & Rodack, LLP

(57) ABSTRACT

An electronic apparatus is provided. The electronic apparatus includes a printed circuit board (PCB) with a first signal path and a second signal path therein, a first finger disposed on the first signal path, a second finger disposed on the second signal path, a controller disposed on the PCB and coupled to a first memory via the first finger and to a second memory via the second finger, and a damping device disposed on the second signal path. The first and second signal paths share a common segment between the controller and a branch point on the PCB. The damping device is disposed between the second finger and the branch point. The distance between the first finger and the branch point within the first signal path is smaller than the distance between the second finger and the branch point within the second signal path.

18 Claims, 5 Drawing Sheets

ELECTRONIC APPARATUS

CROSS REFERENCE TO RELATED APPLICATIONS

This application claims priority of U.S. Provisional Application No. 62/162,299, filed on May 15, 2015, the entirety of which is incorporated by reference herein.

BACKGROUND OF THE INVENTION

Field of the Invention

The invention relates to an electronic apparatus, and more particularly to an electronic apparatus comprising a printed circuit board (PCB) with a plurality of memories therein.

Description of the Related Art

As printed circuit board (PCB) technology advances so that electronic apparatuses made therefrom may operate faster and be designed more densely, electromagnetic interference (EMI) problems in electronic apparatuses have increased. For example, in an electronic apparatus, a memory with high data rate may induce reflection effects at signal paths between the memory and a controller thereof when the memory is accessed by the controller. Therefore, I/O pins of a memory with on-die termination (ODT) or damping resistors disposed on the signal paths between the controller and the I/O pins of the memory without ODT are generally used to decrease the reflection effects.

Nowadays, more than one memory may be implemented in an electronic apparatus, so as to provide larger data storage areas for complex applications. However, not all of the I/O pins within a memory have ODT design for reducing reflection effects. Thus, parallel or series terminations are used on the signal paths of the I/O pins without ODT on the PCB. Parallel termination means that a termination device and the signal path of one of the I/O pins without ODT are coupled in parallel on the PCB. Series termination means that a termination device and the signal path of the one I/O pin without ODT are coupled in series on the PCB. In general, series termination is the most popular design, due to its low cost. However, the termination device will cause leakage, and the power consumption of the electronic apparatus is increased. If the termination device is not disposed on the PCB, the floating stub on the PCB that is designed to be coupled to the termination device may cause reflections due to the antenna effect.

Therefore, a PCB that is designed to reduce reflections for a plurality of memories therein is desirable.

BRIEF SUMMARY OF THE INVENTION

Electronic apparatuses are provided. An embodiment of an electronic apparatus is provided. The electronic apparatus comprises a printed circuit board (PCB) with a first signal path and a second signal path, a first finger disposed on the first signal path, a second finger disposed on the second signal path, a controller disposed on the PCB and coupled to a first memory via the first finger and to a second memory via the second finger, and a first damping device disposed on the second signal path. The controller accesses the first and second memories through the first and second signal paths, respectively. The first and second signal paths share a first common segment between the controller and a first branch point on the PCB. The first damping device is disposed between the second finger and the first branch point. The distance between the first finger and the first branch point within the first signal path is smaller than the distance between the second finger and the first branch point within the second signal path.

Furthermore, another embodiment of an electronic apparatus is provided. The electronic device comprises a printed circuit board (PCB), a controller on the PCB, a first memory on the PCB, a second memory on the PCB, and a first damping device on the surface of the substrate. The PCB comprises a substrate comprising a surface, a plurality of fingers on the surface of the substrate, a first conductive trace on the surface of the substrate, a second conductive trace on the surface of the substrate, and a third conductive trace on the surface of the substrate. The first, second and third conductive traces are electrically crossed in a first branch point of the substrate. The first conductive trace is disposed between a first finger of the plurality of fingers and the first branch point of the substrate, the second conductive trace is disposed between a second finger of the plurality of fingers and the first branch point of the substrate, and the third conductive trace is disposed between a third finger of the plurality of fingers and the first branch point of the substrate. The controller comprises a pin electrically coupled to the first conductive trace of the PCB through the first finger of the PCB. The first memory comprises a pin electrically coupled to the second conductive trace of the PCB through the second finger of the PCB. The second memory comprises a pin electrically coupled to the third conductive trace of the PCB through the third finger of the PCB. The first damping device divides the third conductive trace into a first sub-trace between the first damping device and the first branch point and a second sub-trace between the first damping device and the third finger. The length of the second conductive trace is shorter than that of the first sub-trace of the third conductive trace.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
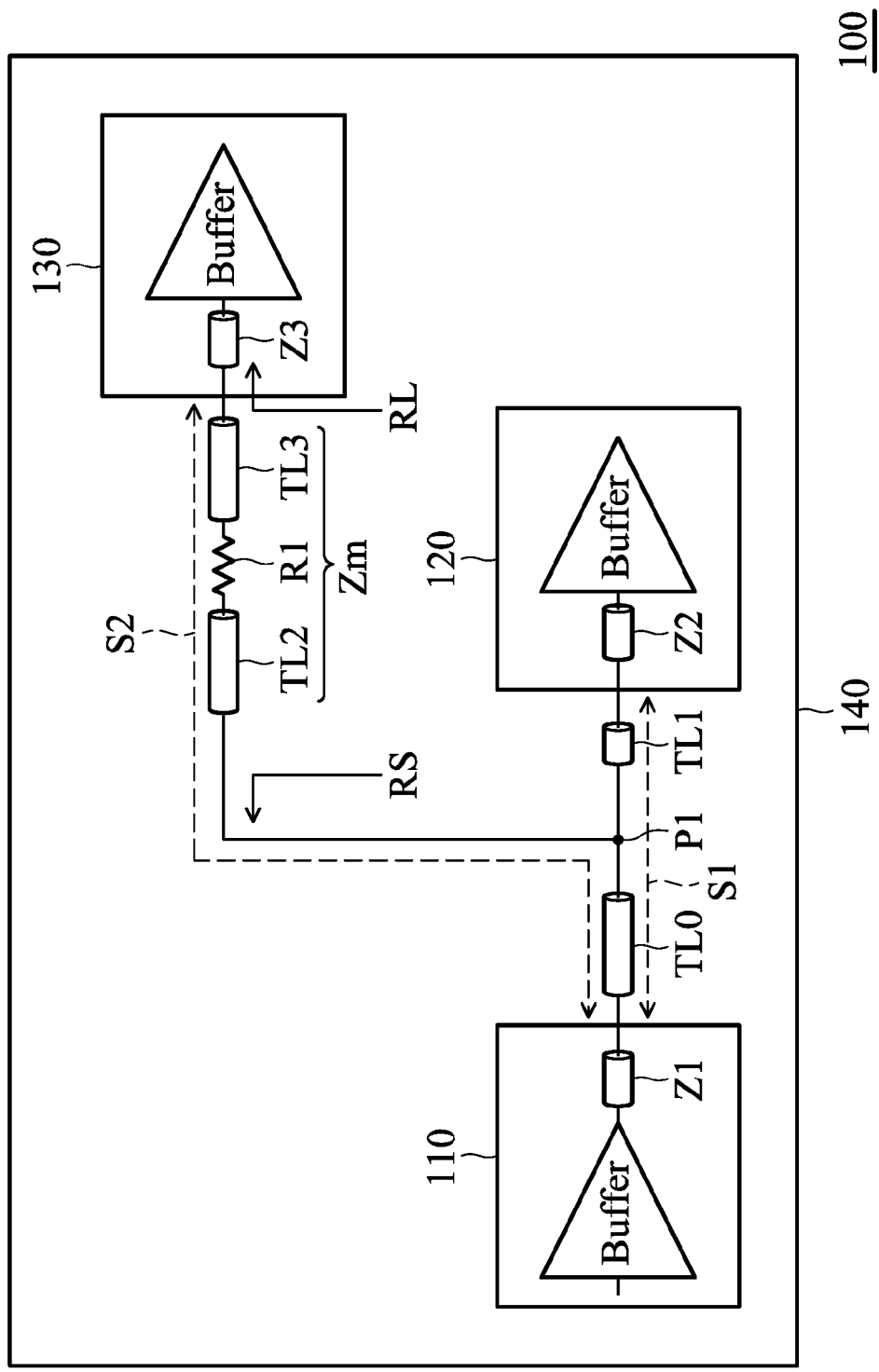
FIG. 1A shows a schematic illustrating an electronic apparatus according to an embodiment of the invention.

FIG. 1A shows a schematic illustrating an electronic apparatus 100 according to an embodiment of the invention. The electronic apparatus 100 comprises a printed circuit board (PCB) 140 that is able to supply two memories. In the electronic apparatus 100, an I/O block 110 represents one pin of a controller (not shown), which is used to provide a specific signal, such as an address, data, a chip select, a write enable signal, and so on, to an I/O block 120 of a first memory and an I/O block 130 of a second memory. In the embodiment, the I/O block 120 represents one pin of the first memory corresponding to the specific signal, and the I/O block 130 represents one pin of the second memory corresponding to the specific signal. In addition, the inner equivalent impedances of the I/O blocks 110, 120 and 130 are shown as the impedances Z1, Z2 and Z3, respectively. In the embodiment, the controller and the first and second memories are three independent chips disposed on the PCB 140. The I/O block 110 of the controller provides the specific signal to the I/O block 120 of the first memory through a transmission line TL0 and a transmission line TL1 which form a signal path S1. Simultaneously, the I/O block 110 of the controller provides the specific signal to the I/O block 130 of the second memory through the transmission line TL0, a transmission line TL2, a resistor R1 and a transmission line TL3 which form a signal path S2. Therefore, the controller can access the first and second memories through the signal paths S1 and S2, respectively. In addition, the signal paths S1 and S2 have a common segment shared between the I/O block 110 and a branch point P1 on the PCB 140, i.e. the transmission line TL0.

In FIG. 1A, the I/O blocks 120 and 130 represent the pins of the first and second memories without on-die termination (ODT), such as the pins of a double data rate (DDR) SDRAM, address/command/control pins of a DDR2 and DDR3 SDRAM, and so on. The resistor R1 is a damping device, and the damping device is disposed between the I/O block 120 and the branch point P1 within the signal path S2. In the signal path S2, the ratio of the transmission line TL2 to the transmission line TL3 is determined according to actual application. For example, the R1 is disposed on any location between the I/O block 130 and the branch point P1, i.e. the transmission line TL2 may be shorter than, equal to, or larger than the transmission line TL3. Furthermore, the maximum length of the signal path S2 is determined according to the frequency of the specific signal. It should be noted that the transmission line TL1 is shorter than the transmission line TL2, i.e. the distance between the I/O block 120 and the branch point P1 within the signal path S1 is smaller than the distance between the I/O block 130 and the branch point P1 within the signal path S2. In one embodiment, the transmission line TL1 is short enough and near to the branch point P1. For the I/O block 110 of the controller, the first memory is a near-end device and the second memory is a far-end device, i.e. the signal path S2 is longer than the signal path S1. Furthermore, no floating stub or termination device is disposed in the signal paths S1 and S2. In the embodiment, the resistor R1 is capable of eliminating or reducing reflections from the I/O block 130 of the second memory when the specific signal is transmitted from the I/O block 110. Furthermore, the resistor R1 is capable of adjusting the driving strength of the specific signal to be transmitted to the I/O block 130, e.g. the amplitude of the specific signal. Thus, the reflections from the I/O block 130 can also be decreased because of the lower driving strength. It should be noted that no damping device is disposed in the signal path S1. Therefore, the amplitude of the specific signal received by the I/O block 120 is larger than the amplitude of the specific signal received by the I/O block 130.

Figure 1B:
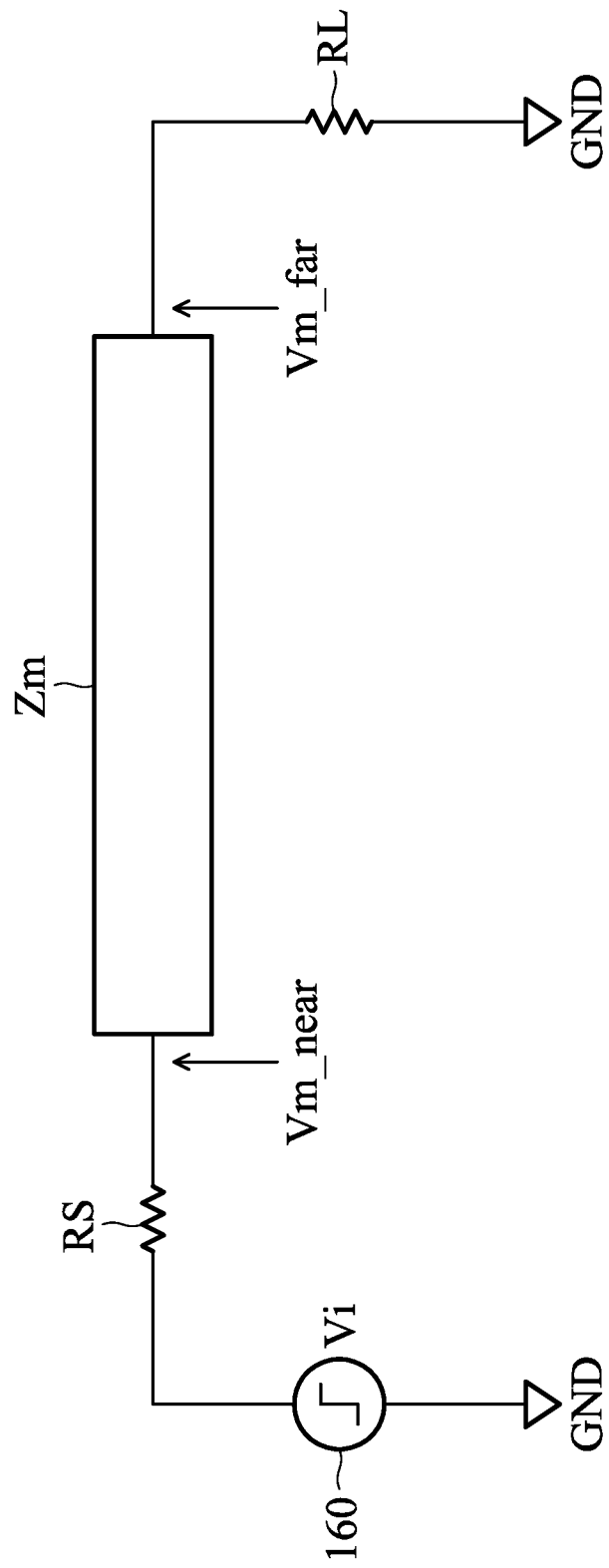
FIG. 1B shows an equivalent circuit of an impedance of FIG. 1A.

FIG. 1B shows an equivalent circuit of an impedance Zm of FIG. 1A. Referring to FIG. 1A and FIG. 1B together, the impedance Zm is formed by the transmission line TL2, the resistor R1 and the transmission line TL3 connected in series. Furthermore, a resistor RS is the output impedance seen by the impedance Zm, and a resistor RL is the input impedance seen by the impedance Zm. A voltage source 160 represents a voltage Vi, wherein the voltage Vi indicates a voltage amplitude of the specific signal provided by the I/O block 110. Moreover, a near-end voltage Vm_near and a far-end voltage Vm_far are obtained according to the following equations:

$$\text{Vm\_near}(0, t) = \frac{Zm}{Zm + RS} \cdot \left[ Vm(t) + \Gamma_{RL} \cdot (1 + \Gamma_{RS}) \cdot Vi\left(t - \frac{2l}{Vm}\right) \right]; \text{ and}$$

$$\text{Vm\_far}(l, t) = \frac{Zm}{Zm + RS} \cdot (1 + \Gamma_{RL}) \cdot Vi\left(t - \frac{l}{Vm}\right),$$

where $$\Gamma_{RL} = \frac{RL - Zm}{RL + Zm} \text{ and } \Gamma_{RS} = \frac{RS - Zm}{RS + Zm}.$$

Ideally, $\Gamma_{RL}$ and $\Gamma_{RS}$ are equal to zero. Furthermore, the near-end voltage Vm_near represents an amplitude of the specific signal to be transmitted to the I/O block 120, and the far-end voltage Vm_far represents an amplitude of the specific signal to be transmitted to the I/O block 130. Moreover, l represents the length of the impedance Zm, t represents the transfer time of the specific signal, and Vm represents the velocity of the specific signal. According to the equations, reflection coefficient can be controlled by the resistor R1.

Figure 2:
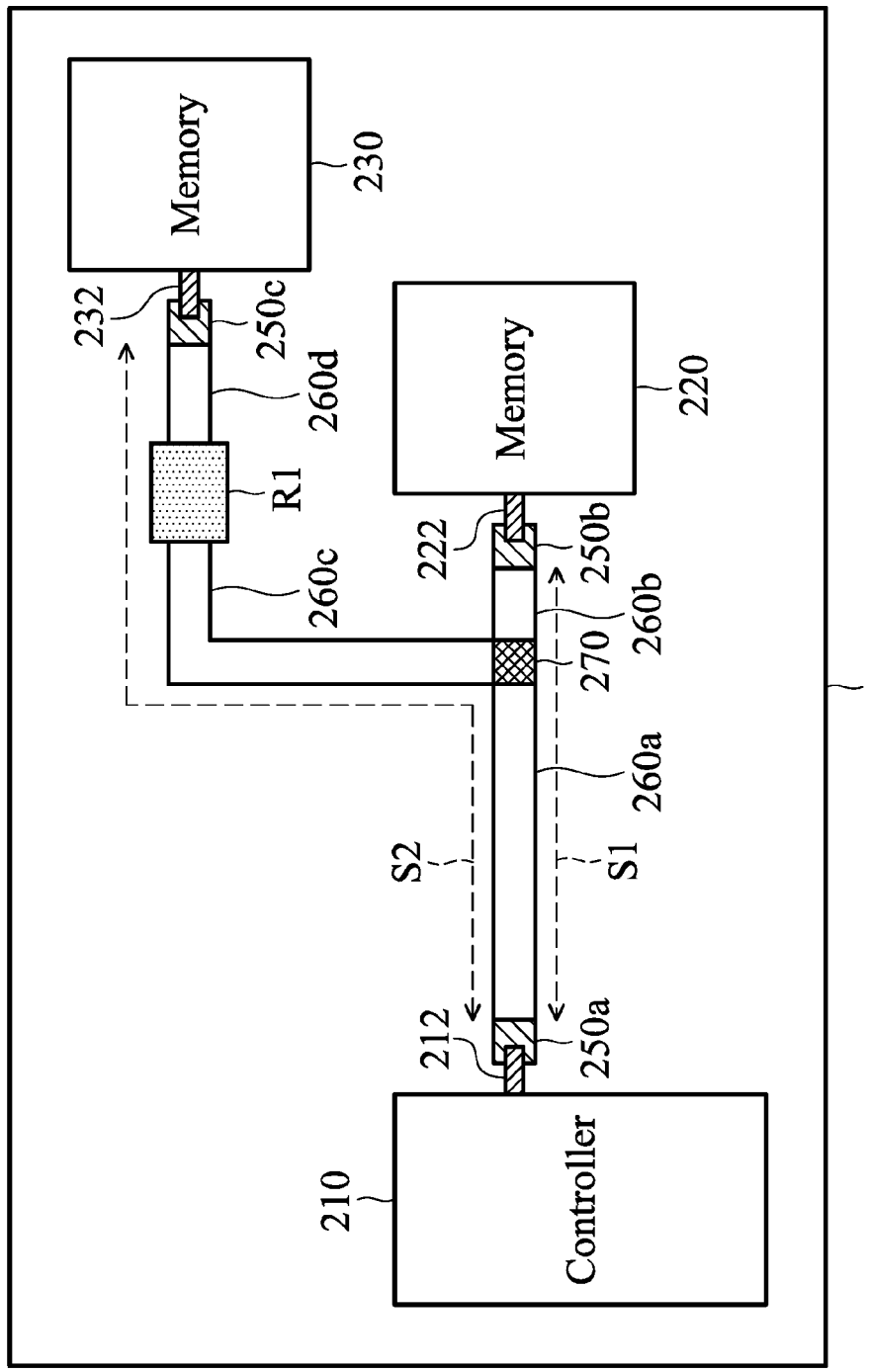
FIG. 2 shows a top view illustrating a PCB of an electronic apparatus according to an embodiment of the invention.

FIG. 2 shows a top view illustrating a PCB 240 of an electronic apparatus 200 according to an embodiment of the invention. The electronic apparatus 200 further comprises a controller 210, two memories 220 and 230, wherein the controller 210 and the two memories 220 and 230 are mounted on the PCB 240. The PCB 240 comprises a substrate having a surface (not shown). In the embodiment, the fingers 250a-250c, the conductive traces 260a-260d and a branch point 270 are disposed on the surface of the substrate of the PCB 240. A pin 212 of the controller 210 is soldered to the finger 250a of the PCB 240, a pin 222 of the memory 220 is soldered to the finger 250b of the PCB 240, and a pin 232 of the memory 230 is soldered to the finger 250c of the PCB 240. In addition, a resistor R1 is also soldered to the PCB 240 for the memory 230. In the embodiment, only one signal transmitted between the controller 210 and the memories 220 and 230 is illustrated in order to simplify the description. Furthermore, the controller 210 and the memories 220 and 230 may be packaged in any type of package, such as a quad flat package (QFP), a ball grid array (BGA) and so on. As described above, the controller 210 accesses the memory 220 through a signal path S1 comprising the conductive trace 260a, the branch point 270 and the conductive trace 260b. Furthermore, the controller 210 accesses the memory 230 through a signal path S2 comprising the conductive trace 260a, the branch point 270, the conductive trace 260c, the resistor R1 and the conductive trace 260d. The conductive traces 260a, 260b and 260c are electrically crossed in the branch point 270 on the PCB 240. In one embodiment, the branch point 270 may be a via/hole of the PCB 240 when the conductive traces 260a, 260b and 260c are disposed on different layers within the substrate of PCB 240.

In FIG. 2, the memory 220 is a near-end device and the memory 230 is a far-end device for the controller 210. The conductive trace 260a is a common segment of the signal paths S1 and S2, and the resistor R1 is disposed in another segment of the signal path S2 other than the common segment. The conductive trace 260b is shorter than the conductive trace 260c. In the embodiment, the pin 222 of the memory 220 and the pin 232 of the memory 230 have no ODT therein. The resistor R1 is a damping device for damping the reflections from the pin 232 of the memory 230 when the controller 210 transmits a signal to the memories 220 and 230 via the pin 212. In one embodiment, the finger 250b is arranged near the branch point 270 on the PCB. It should be noted that no damping device is implemented in the signal path S1. Thus, the signal transmitted in the signal path S1 will not be attenuated. As described above, the signal transmitted in the signal path S2 will be attenuated because of the resistor R1, thereby the reflections from the pin 232 of the memory 230 can be decreased, wherein the reflections from the pin 232 of the memory 230 will affect the signal transmitted in the signal path S1. Therefore, compared to conventional designs, the eye-opening of the eye diagram corresponding to the signals of the memory 220 accessed by the controller 210 is wider, and the signal skew is smaller.

Figure 3:
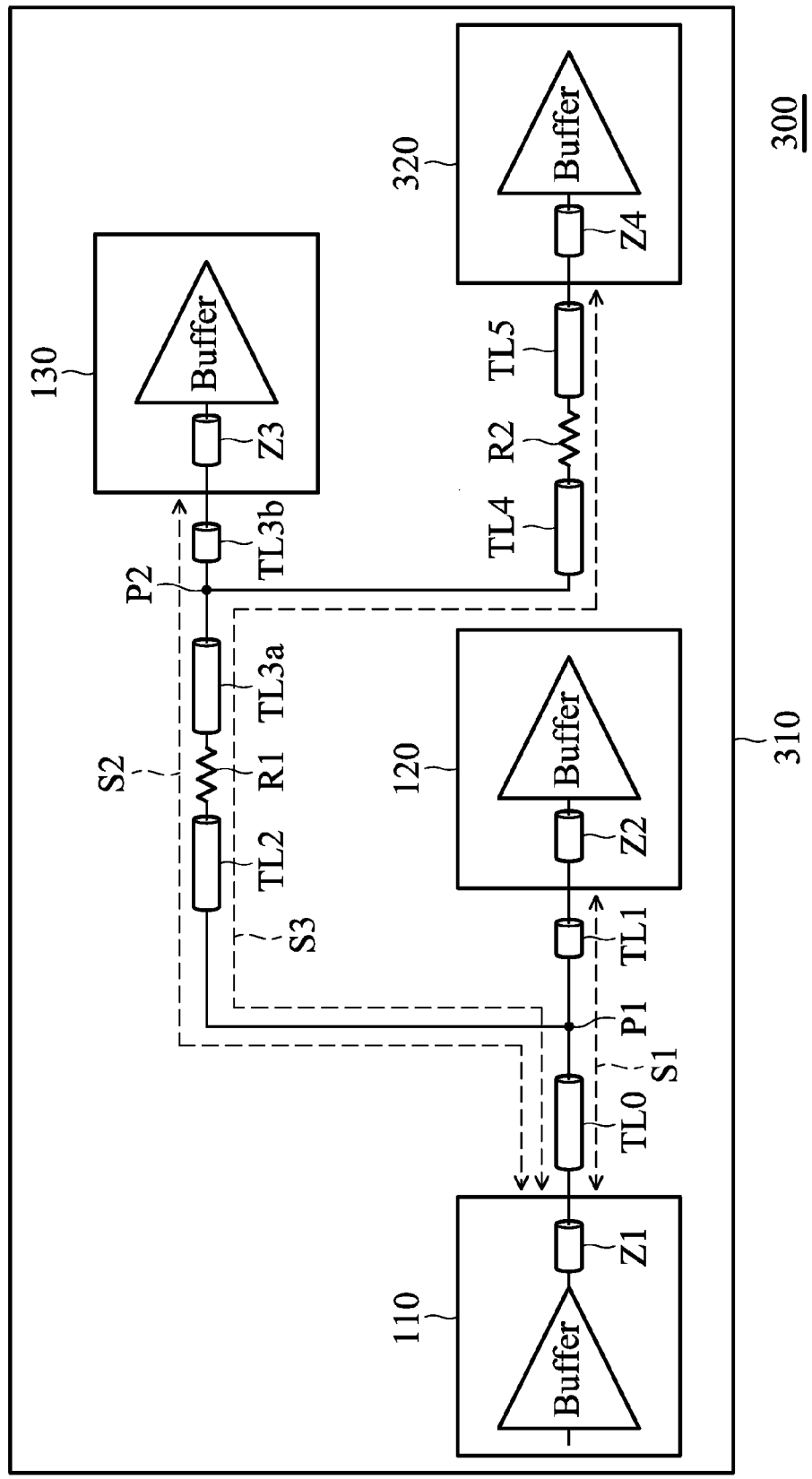
FIG. 3 shows a schematic illustrating an electronic apparatus according to another embodiment of the invention.

FIG. 3 shows a schematic illustrating an electronic apparatus 300 according to another embodiment of the invention. The electronic apparatus 300 has a PCB 310 that is able to supply three memories or more. Compared to the electronic apparatus 100 of FIG. 1A, the electronic apparatus 300 further comprises an I/O block 320 of a third memory, the transmission lines TL4 and TL5 and a resistor R2. In the embodiment, the I/O block 320 represents one pin of the third memory corresponding to the specific signal provided by the I/O block 110. In addition, the inner equivalent impedance of the I/O block 320 is shown as the impedance Z4. In FIG. 3, the I/O blocks 120, 130 and 320 represent the pins of the first, second and third memories without ODT. In the embodiment, the controller and the first, second and third memories are the independent chips disposed on the PCB 310. As described above, the I/O block 110 of the controller provides the specific signal to the I/O block 120 of the first memory via a signal path S1 formed by the transmission line TL0 and the transmission line TL1. Simultaneously, the I/O block 110 of the controller provides the specific signal to the I/O block 130 of the second memory via a signal path S2 formed by the transmission line TL0, a transmission line TL2, a resistor R1, a transmission line TL3a and a transmission line TL3a. In one embodiment, the transmission line TL3 of FIG. 1A is divided into the two transmission lines TL3a and TL3b of FIG. 3. Furthermore, the I/O block 110 of the controller provides the specific signal to the I/O block 320 of the third memory via a signal path S3 formed by the transmission line TL0, the transmission line TL2, the resistor R1, the transmission line TL3a, a transmission line TL4, a resistor R2 and a transmission line TL5. Therefore, the controller can access the first, second and third memories through the signal paths S1, S2 and S3, respectively. In the embodiment, the signal paths S1, S2 and S3 have a common segment shared between the I/O block 110 and a branch point P1 on the PCB 310, i.e. the transmission line TL0. Moreover, except for the transmission line TL0, the signal paths S2 and S3 have another common segment shared between the branch point P1 and a branch point P2 on the PCB 310, i.e. the transmission line TL2, the resistor R1 and the transmission line TL3a.

In FIG. 3, the resistor R1 is a damping device, and the damping device is disposed between the branch points P1 and P2. The ratio of the transmission line TL2 to the sum of the transmission lines TL3a and TL3b is determined according to actual application. In one embodiment, the transmission line TL3b is short enough and near to the branch point P2. In additional, the resistor R2 is a damping device, and the damping device is disposed between the branch point P2 and the I/O block 320. The ratio of the transmission line TL4 to the transmission line TL5 is determined according to actual application. For example, the resistor R2 is disposed on any location between the I/O block 320 and the branch point P2, i.e. the transmission line TL4 may be shorter than, equal to, or larger than the transmission line TL5. It should be noted that the transmission line TL1 is shorter than the transmission line TL2, i.e. the distance between the I/O block 120 and the branch point P1 within the signal path S1 is smaller than the distance between the I/O block 130 and the branch point P1 within the signal path S2. Furthermore, the transmission line TL3b is shorter than the transmission line TL4, i.e. the distance between the I/O block 130 and the branch point P2 within the signal path S2 is smaller than the distance between the I/O block 320 and the branch point P2 within the signal path S3. For the I/O block 110 of the controller, the first memory is a near-end device, and the second and third memories are far-end devices. In the embodiment, the signal path S2 is longer than the signal path S1, and the signal path S3 is longer than the signal path S2. Furthermore, no floating stub or termination device is arranged in the signal paths S1, S2 and S3. When the specific signal is transmitted from the I/O block 110, the resistor R2 is capable of eliminating or reducing reflections from the I/O block 320 of the third memory, and the resistor R1 is capable of eliminating or reducing reflections from the I/O block 320 of the third memory and the I/O block 130 of the second memory. Furthermore, the resistor R1 is capable of adjusting the driving strength of the specific signal to be transmitted to the I/O block 130 and the I/O block 320, e.g. the amplitude of the specific signal, and the resistor R2 is capable of adjusting the driving strength of the specific signal to be transmitted to the I/O block 320. Thus, the reflections from the I/O block 130 and the I/O block 320 can be decreased because of the lower driving strength. It should be noted that no damping device is implemented in the signal path S1. Thus, the signal transmitted in the signal path S1 will not be attenuated. Therefore, the amplitude of the specific signal received by the I/O block 120 is larger than the amplitude of the specific signal received by the I/O block 130. Furthermore, because of the two damping resistors R1 and R2 disposed in the signal path S3, the amplitude of the specific signal received by the I/O block 130 is larger than the amplitude of the specific signal received by the I/O block 320.

Figure 4:
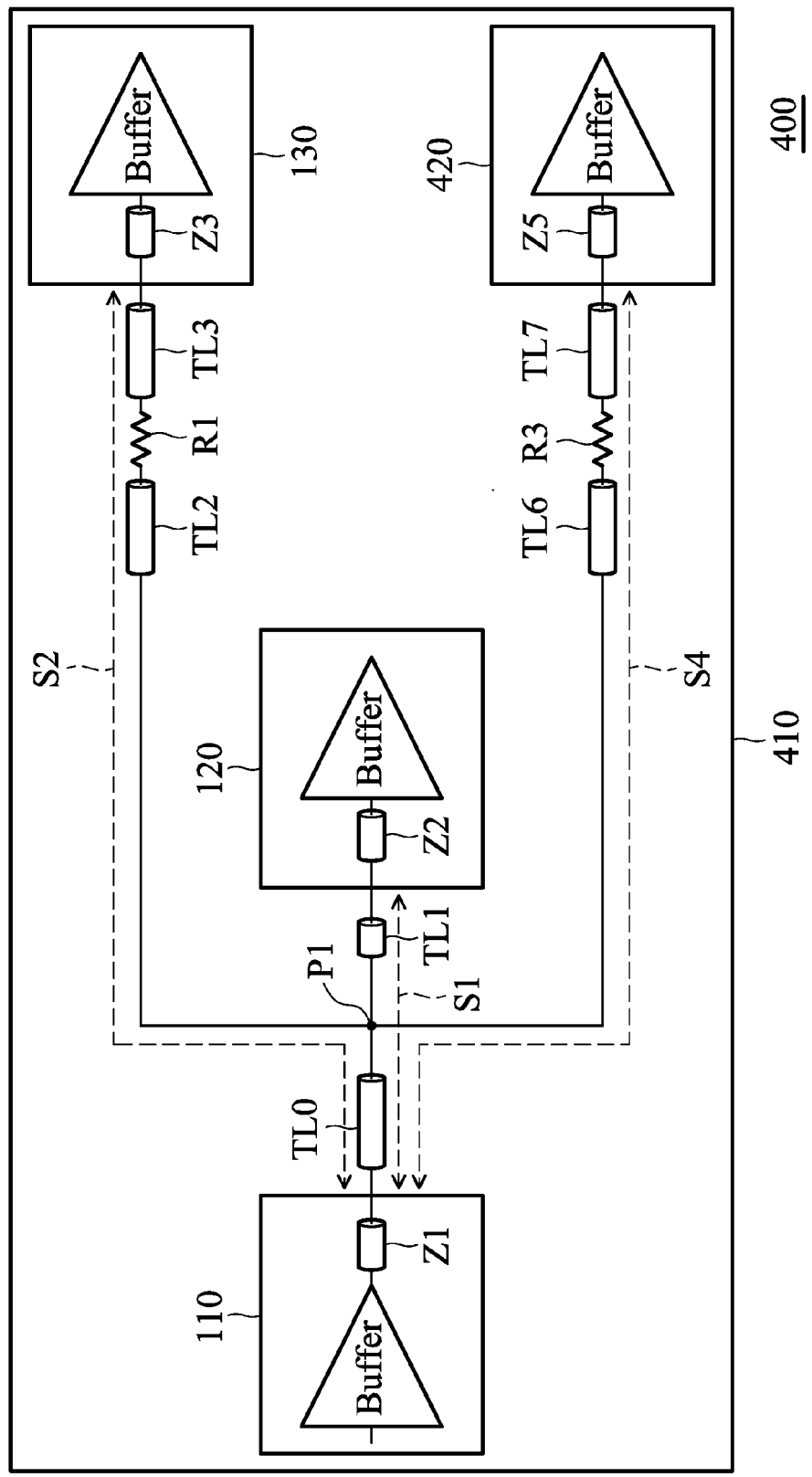
FIG. 4 shows a schematic illustrating an electronic apparatus 400 according to another embodiment of the invention.

FIG. 4 shows a schematic illustrating an electronic apparatus 400 according to another embodiment of the invention. The electronic apparatus 400 comprises a PCB 410 that is able to supply three memories or more. Compared to the electronic apparatus 100 of FIG. 1A, the electronic apparatus 400 further comprises an I/O block 420 of a third memory, the transmission lines TL6 and TL7 and a resistor R3. In the embodiment, the I/O block 420 represents one pin of the third memory corresponding to the specific signal provided by the I/O block 110. In addition, the inner equivalent impedance of the I/O block 420 is shown as the impedance Z5. In FIG. 4, the I/O blocks 120, 130 and 420 represent the pins of the first, second and third memories without ODT. In the embodiment, the controller and the first, second and third memories are the independent chips disposed on the PCB 410. As described above, the I/O block 110 of the controller provides the specific signal to the I/O block 120 of the first memory via a signal path S1 formed by the transmission line TL0 and the transmission line TL1. Simultaneously, the I/O block 110 of the controller provides the specific signal to the I/O block 130 of the second memory via a signal path S2 formed by the transmission line TL0, a transmission line TL2, a resistor R1, and a transmission line TL3. Furthermore, the I/O block 110 of the controller provides the specific signal to the I/O block 420 of the third memory via a signal path S4 formed by the transmission line TL0, a transmission line TL6, a resistor R3, and a transmission line TL7. Therefore, the controller can access the first, second and third memories through the signal paths S1, S2 and S4, respectively. In the embodiment, the signal paths S1, S2 and S4 have a common segment shared between the I/O block 110 and a branch point P1 on the PCB 410, i.e. the transmission line TL0.

In FIG. 4, the resistor R1 is a damping device, and the damping device is disposed between the branch point P1 and the I/O block 130. The ratio of the transmission line TL2 to the transmission line TL3 is determined according to actual application. In additional, the resistor R3 is a damping device, and the damping device is disposed between the branch point P1 and the I/O block 420. The ratio of the transmission line TL6 to the transmission line TL7 is determined according to actual application. For example, the resistor R3 is disposed on any location between the I/O block 420 and the branch point P1, i.e. the transmission line TL6 may be shorter than, equal to, or larger than the transmission line TL7. It should be noted that the transmission line TL1 is shorter than the transmission line TL2 and the transmission line TL6, i.e. the distance between the I/O block 120 and the branch point P1 within the signal path S1 is smaller than the distance between the I/O block 130 and the branch point P1 within the signal path S2 or the distance between the I/O block 420 and the branch point P1 within the signal path S4. For the I/O block 110 of the controller, the first memory is a near-end device, and the second and third memories are far-end devices. In the embodiment, the signal path S2 is longer than the signal path S1, and the signal path S3 may be equal to the signal path S2. Furthermore, no floating stub or termination device is implemented in the signal paths S1, S2 and S3. In the embodiment, when the specific signal is transmitted from the I/O block 110, the resistor R3 is capable of eliminating or reducing reflections from the I/O block 420 of the third memory, and the resistor R1 is capable of eliminating or reducing reflections from the I/O block 130 of the second memory. Furthermore, the resistor R1 is capable of adjusting the driving strength of the specific signal to be transmitted to the I/O block 130, and the resistor R3 is capable of adjusting the driving strength of the specific signal to be transmitted to the I/O block 420. Thus, the reflections from the I/O block 130 and the I/O block 420 can be decreased because of the lower driving strength. It should be noted that no damping device is implemented in the signal path S1. Therefore, the amplitude of the specific signal received by the I/O block 120 is larger than the amplitude of the specific signal received by the I/O block 130 and the I/O block 420.

According to the embodiments, by implementing the damping devices on the longer signal paths corresponding to the far-end devices, the driving strength of the signals transmitted in the longer signal paths can be decreased, and the reflections from the far-end devices also can be decreased, thereby the influence caused by the reflections can be decreased for the near-end devices.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic apparatus, comprising:
   a printed circuit board (PCB) with a first signal path and a second signal path therein;
   a first finger disposed on the first signal path;
   a second finger disposed on the second signal path;
   a controller disposed on the PCB and coupled to a first memory via the first finger and to a second memory via the second finger, for accessing the first memory through the first signal path and the second memory through the second signal path, wherein the first signal path and the second signal path share a first common segment between the controller and a first branch point on the PCB; and
   a first damping device disposed on the second signal path and between the second finger and the first branch point,
   wherein a distance between the first finger and the first branch point within the first signal path is smaller than a distance between the first damping device and the first branch point within the second signal path;
   wherein the first memory and the second memory are disposed on the PCB; and
   wherein each pin of the first memory coupled to the first finger is a pin without on-die termination, and each pin of the second memory electrically coupled to the second finger is a pin without on-die termination, and wherein the first signal path is free from any damping device.

2. The electronic apparatus as claimed in claim 1, wherein no damping device is disposed on the first signal path.

3. The electronic apparatus as claimed in claim 1, wherein each pin of the first memory coupled to the first finger is a pin without on-die termination, and each pin of the second memory electrically coupled to the second finger is a pin without on-die termination.

4. The electronic apparatus as claimed in claim 1, wherein no floating stub or no termination device is arranged on the first signal path and the second signal path.

5. The electronic apparatus as claimed in claim 1, further comprising:
   a third finger disposed on a third signal path on the PCB, wherein the controller accesses a third memory through the third signal path; and
   a second damping device disposed on the third signal path,
   wherein the first signal path, the second signal path, and the third signal path share the first common segment between the controller and the first branch point on the PCB, and the second signal path and the third signal path share a second common segment between the first branch point and a second branch point on the PCB.

6. The electronic apparatus as claimed in claim 5, wherein the second damping device is disposed between the third finger and the second branch point within the third signal path, wherein a distance between the second finger and the second branch point within the second signal path is smaller than a distance between the third finger and the second branch point within the third signal path.

7. The electronic apparatus as claimed in claim 5, wherein the third memory is disposed on the PCB for the controller, and no floating stub or no termination device is arranged on the third signal path.

8. The electronic apparatus as claimed in claim 1, further comprising:
   a third finger disposed on a third signal path on the PCB, wherein the controller accesses a third memory through the third signal path; and
   a second damping device disposed on the third signal path and between the third finger and the first branch point on the PCB,
   wherein the first signal path, the second signal path, and the third signal path share the first common segment between the controller,
   wherein a distance between the second finger and the first branch point within the second signal path is equal to a distance between the third finger and the first branch point within the third signal path.

9. The electronic apparatus as claimed in claim 8, wherein no floating stub or no termination device is arranged on the second signal path and the third signal path.

10. An electronic apparatus, comprising:
    a printed circuit board (PCB), comprising:
    a substrate having a surface;
    a plurality of fingers on the surface of the substrate;
    a first conductive trace on the surface of the substrate;
    a second conductive trace on the surface of the substrate; and
    a third conductive trace on the surface of the substrate,
    wherein the first conductive trace, the second conductive trace and the third conductive trace are electrically connected in a first branch point of the substrate,
    wherein the first conductive trace is disposed between a first finger of the plurality of fingers and the first branch point of the substrate, the second conductive trace is disposed between a second finger of the plurality of fingers and the first branch point of the substrate, and the third conductive trace is disposed between a third finger of the plurality of fingers and the first branch point of the substrate;
    a controller on the PCB, comprising a pin electrically coupled to the first conductive trace of the PCB through the first finger of the PCB;
    a first memory on the PCB, comprising a pin electrically coupled to the second conductive trace of the PCB through the second finger of the PCB;
    a second memory on the PCB, comprising a pin electrically coupled to the third conductive trace of the PCB through the third finger of the PCB; and
    a first damping device on the surface of the substrate, dividing the third conductive trace into a first sub-trace between the first damping device and the first branch point and a second sub-trace between the first damping device and the third finger,
    wherein a length of the second conductive trace is shorter than that of the first sub-trace of the third conductive trace, and wherein the second conductive trace is free from any damping device;
    wherein the first memory and the second memory are disposed on the PCB; and
    wherein each pin of the first memory coupled to the first finger is a pin without on-die termination, and each pin of the second memory electrically coupled to the second finger is a pin without on-die termination.

11. The electronic apparatus as claimed in claim 10, wherein no damping device is coupled to the second conductive trace.

12. The electronic apparatus as claimed in claim 10, wherein each pin of the first memory electrically coupled to the second finger is a pin without on-die termination, and each pin of the second memory electrically coupled to the third finger is a pin without on-die termination.

13. The electronic apparatus as claimed in claim 10, wherein no floating stub or no termination device is coupled to the second conductive trace and the third conductive trace.

14. The electronic apparatus as claimed in claim 10, further comprising:
    a second damping device on the surface of the substrate, wherein the PCB further comprises:
    a fourth conductive trace on the surface of the substrate, wherein the fourth conductive trace is disposed between a fourth finger of the plurality of fingers and a second branch point of the substrate,
    wherein the third and fourth conductive traces are electrically crossed in the second branch point of the substrate,
    wherein the second damping device divides the fourth conductive trace into a third sub-trace between the second damping device and the second branch point and a fourth sub-trace between the second damping device and the fourth finger.

15. The electronic apparatus as claimed in claim 14, wherein a distance between the third finger and the second branch point on the third conductive trace is smaller than a distance between the second damping device and the second branch point on the fourth conductive trace.

16. The electronic apparatus as claimed in claim 14, wherein the third memory is disposed on the PCB for the controller, and no floating stub or no termination device is coupled to the fourth conductive trace.

17. The electronic apparatus as claimed in claim 10, further comprising:
    a second damping device on the surface of the substrate, wherein the PCB further comprises:
    a fourth conductive trace on the surface of the substrate, wherein the fourth conductive trace is disposed between a fourth finger of the plurality of fingers and the first branch point of the substrate,
    wherein the first conductive trace, the second conductive trace, the third conductive trace and the fourth conductive trace are electrically crossed in the first branch point of the substrate,
    wherein the second damping device divides the fourth conductive trace into a third sub-trace between the second damping device and the first branch point and a fourth sub-trace between the second damping device and the fourth finger,
    wherein the length of the third conductive trace is equal to that of the fourth conductive trace.

18. The electronic apparatus as claimed in claim 17, wherein no floating stub or no termination device is coupled to the third and fourth conductive traces.

* * * * *